Figure 1:
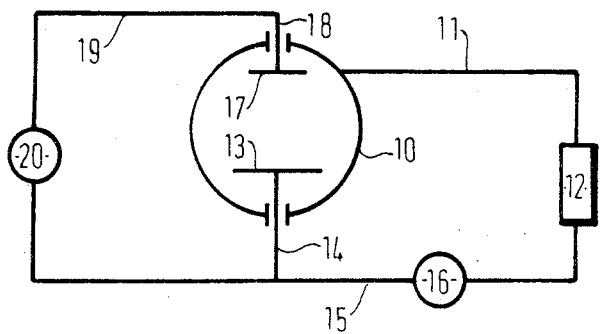

United States Patent [19]

Davenport et al.

[11] Patent Number: 4,587,458
[45] Date of Patent: May 6, 1986

[54] CONTROLLING CURRENT DENSITY

[75] Inventors: John Davenport, Cambridge, England; Michael A. Russo, Trevose, Pa.

[73] Assignee: TI (Group Services) Limited, Birmingham, England

[21] Appl. No.: 629,812

[22] Filed: Jul. 11, 1984

[30] Foreign Application Priority Data

Feb. 17, 1984 [GB] United Kingdom ............... 8404173

[51] Int. Cl.⁴ ..................... G01N 23/00; H01J 7/24
[52] U.S. Cl. ........................ 315/111.01; 250/309;
  250/310; 250/492.3; 250/492.2; 315/111.81
[58] Field of Search ............... 250/492.3, 492.21, 306,
  250/309, 310; 219/121 PR, 130.01; 315/111.01,
  111.81

[56] References Cited

U.S. PATENT DOCUMENTS

| Re. 31,043 | 9/1982 | McKinney | 250/492.3 |
| 3,573,454 | 4/1971 | Aderson | 250/309 |
| 3,699,384 | 10/1972 | Eckhardt | 315/111.01 |
| 3,838,313 | 9/1974 | Anderson | 250/492.3 |
| 4,331,486 | 5/1982 | Chenevas-Paule et al. | 250/492.21 |

Primary Examiner—Harold Dixon
Attorney, Agent, or Firm—Kemon & Estabrook

[57] ABSTRACT

A vacuum furnace for the ionic surface treatment of workpieces in which the workpiece is connected as one of a pair of electrodes of opposite polarity, and in which a third electrode is located adjacent the workpiece and is connected to it at the same polarity and potential so as to be subject to the same current density as the workpiece, the current through the third electrode being used to indicate said workpiece current density and to control it.

9 Claims, 3 Drawing Figures

CONTROLLING CURRENT DENSITY

The invention relates to controlling the density of an electric current on a workpiece, when the current passes between the workpiece, arranged as an electrode of one polarity, and another electrode of the opposite polarity.

In several industrial ion processes (sometimes called plasma processes) such as ion plating, plasma carburising or plasma nitriding, the density of the electrical current at the surface of the workpiece affects the resulting surface characteristics of the workpiece. Whilst it is generally quite easy to determine and control the magnitude of the total current passing through the workpiece, it is often not so easy to determine what value of that current will produce the required current density. This is particularly so where the process is performed on a batch of the workpieces, successive batches including different numbers of workpieces, or where the process is performed on successive workpieces of different size or irregular shape.

The determination of workpiece surface area, so that the correct current to achieve a required current density can be calculated, is time consuming and frequently inaccurate. It is an object of this invention to reduce such difficulties.

According to one aspect of the invention, there is provided current density controlling apparatus, for controlling the density of an electric current at the surface of a workpiece during gaseous ionic surface treatment of the workpiece, including a chamber in which the workpiece is located and connected as one electrode of one polarity, a second electrode operative within the chamber and connected at the opposite polarity, gas supply means to provide a gaseous atmosphere within the chamber of required composition, temperature and pressure, wherein the improvement comprises a third electrode of known area within the chamber connected to be at the same polarity and potential as the workpiece, and located adjacent the workpiece and current measuring means connected to measure the current passing through the third electrode and thereby to provide one of a measurement and a control of the common current density at the surface of the third electrode and of the workpiece.

It is thought that the use of the third electrode is particularly beneficial, when it is used as a cathode, in that the potential around it is similar to the complex potential field close to the workpiece where the current is space-charge limited.

Figure 2:
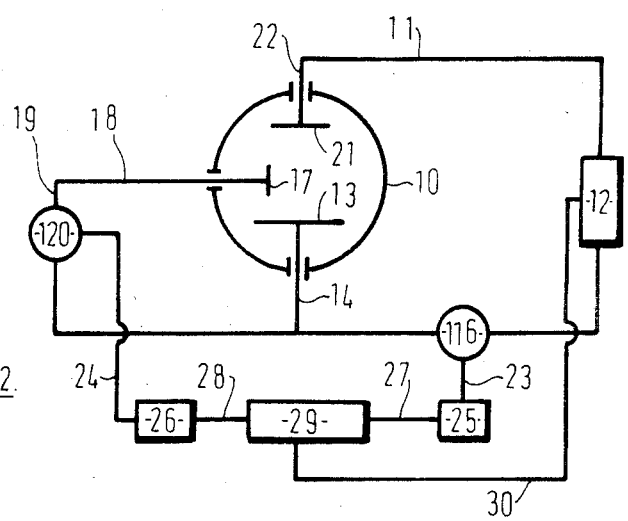
Figure 3:
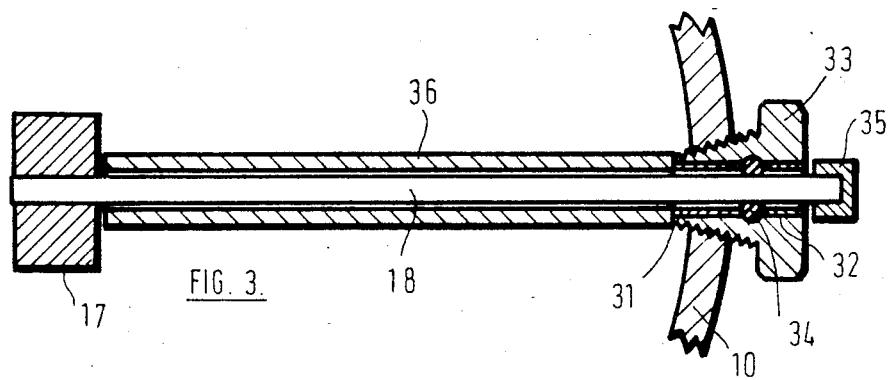

The invention is described by way of example only with reference to the accompanying drawings, which are in diagrammatic form, as applied to plasma carburising, in which:

FIG. 1 is mainly an electrical circuit diagram,
FIG. 2 is a more complex version of FIG. 1, and
FIG. 3 is a longitudinal section through part of the apparatus shown in FIGS. 1 or 2.

In the drawings, a vacuum furnace 10 of cylindrical cross-section is of well known kind and is arranged with its axis horizontal. The lining of the furnace is electrically conductive and is connected by a wire 11 to a power source 12.

A workpiece table 13, positioned within the furnace 10 and electrically insulated therefrom, is mounted on an electrically conductive support rod 14 connected by a wire 15 through a first current meter 16 to the power source 12. The power source 12 supplies direct current (which might be constant or pulsed) and the polarity is such that the lining of the vacuum furnace 10 is the anode and the workpiece table 13 is the cathode.

An auxiliary cathode 17 in the form of a flat plate is mounted within the furnace 10 by an electrically conductive support rod 18 which is insulated from the furnace 10 and is connected by a wire 19 through a second current meter 20 to the support rod 14. Thus the table 13 and auxiliary cathode 17 will always be at the same voltage.

The location of the auxiliary cathode 17 relative to the table 13 and any workpiece thereon must be such that the current density at the surface of the auxiliary cathode 17 will be substantially the same as that on the table 13 and the workpiece thereon.

The process could be of a batch type, with one vacuum chamber, or semi-continuous with additional entry and exit chambers.

The apparatus described so far was used in two experiments:

EXPERIMENT 1

With no workpiece on the table 13 the total cathode surface area was 330 cm$^2$ (table 13 230 cm$^2$+auxiliary cathode 17 100 cm$^2$) the furnace 10 was filled with hydrogen at 2 torr pressure and heated to approximately 900 degrees C. When that temperature was reached the pressure was increased to 10 torr with a gas comprising 5% methane and the remainder hydrogen. Previous experiments showed that the current density must exceed 1.0 mA/cm$^2$ with these conditions for the glow discharge—this is essential for successful ion processing. The total current A through the first current meter 16 was adjusted to give a range of current densities and the corresponding auxiliary cathode current A$_2$ was measured on the second current meter 20. The results are given in the table below:

| Total Cathode Surface Area cm$^2$ | Total Current A Amps | Auxiliary Cathode Current A$_2$ mA | Calculated Current Density mA/cm$^2$ | Measured Current Density mA/cm$^2$ |
|---|---|---|---|---|
| 330 | 0.66 | 200 | 2.0 | 2.0 |
| " | 0.99 | 300 | 3.0 | 3.0 |
| " | 1.32 | 400 | 4.0 | 4.0 |

EXPERIMENT 2

The above procedure was repeated but in this case a workpiece of surface areas 240 cm$^2$ was placed on the table 13 giving a total effective cathode surface area of 570 cm$^2$ (table 13=230 cm$^2$+auxiliary cathode 17=100 cm$^2$+workpiece=240 cm$^2$). The results are given in the table below:

| Total Cathode Surface Area cm$^2$ | Total Current A Amps | Auxiliary Cathode Current A$_2$ mA | Calculated Current Density mA/cm$^2$ | Measured Current Density mA/cm$^2$ |
|---|---|---|---|---|
| 570 | 0.68 | 100 | 1.2 | 1.0 |
| " | 1.12 | 200 | 2.0 | 2.0 |

The power source 12 in these experiments had a maximum output of 1.12 amps. It will be seen that the current density on the workpiece can be readily determined, and therefore set to a required value, by measuring the current density on the auxiliary cathode 17. This technique avoided the need to calculate the surface area of the workpiece.

Although the experiment has been described with reference to plasma carburising, it can be used for other ionic surface treatment processes of a workpiece, for example, plasma nitriding by use of an appropriate gas mixture in the furnace 10. Similarly, by reversing the polarity of the power source 12, the workpiece can be used as an anode where such an arrangement is required.

In FIG. 2 the lining of the furnace 10 is not used as the anode, but a separate anode 21 is provided, mounted on a support rod 22, which may be axially adjustable within the furnace 10. The auxiliary cathode 17 and its support rod 18 are mounted adjacent to the position intended for the workpieces on the table 13. The arrangements of the anodes and cathodes within the furnace in FIG. 2 is equally applicable to FIG. 1 and vice versa.

FIG. 1 shows an arrangement in which substantially constant current density can be achieved on the workpiece surface irrespective of the number and size of the workpieces, by an operator manually adjusting the voltage applied by the power source 12 across the anode 10 and cathode 13, until the required current density is indicated on the second current meter 20.

FIG. 2 shows circuitry which enables the required constant current density to be achieved automatically.

In place of the current meters 16, 20 in FIG. 1, there are provided respective current controllers 116 and 120, which indicate the currents passing therethrough and in addition they emit voltages proportional to said currents along wires 23, 24 through buffer amplifiers 25, 26 connected by wires 27, 28 to a control unit 29. In the control unit 29 the voltages along the wires 27, 28 are compared with a manually adjustable reference voltage and the control unit 29 emits a control voltage along a wire 30 which adjusts the power source 12 until the voltage generated thereby provides the required current density on the auxiliary cathode 17.

For some applications the current controller 116 and associated buffer amplifier 25 and wires 23, 27 can be omitted. In that case, the voltage from the wire 28 is simply compared with the manually adjustable reference voltage within the control unit 29, which emits the required control voltage along the wire 30 to the power source 12.

FIG. 3 shows one method of mounting the auxiliary cathode 17 from the wall of the furnace 10.

The auxiliary cathode 17 is in the form of a thick disc detachably mounted on the end of the support rod 18, the latter being a close fit within electrically insulating sleeves 31, 32 in a screwed tapered plug 33. The plug 33 is screwed into a corresponding tapered threaded bore in the wall of the furnace 10, so that the plug 33 can be removed and replaced easily. The support rod 18 is vacuum sealed to the plug 33 by an O-ring 34.

An electrical connector 35 is fastened on the exterior end of the support rod 18, which is insulated from the plasma glow discharge within the furnace 10 by a protective insulation sleeve 36.

We claim:

1. Current density controlling apparatus, for controlling the density of an electric current at the surface of a workpiece during gaseous ionic surface treatment of the workpiece, including a chamber in which the workpiece is located and connected as one electrode of one polarity, a second electrode operative within the chamber and connected at the opposite polarity, gas supply means to provide a gaseous atmosphere within the chamber of required composition, temperature and pressure, wherein the improvement comprises a third electrode of known area within the chamber connected to be at the same polarity and potential as the workpiece, and located adjacent the workpiece and current measuring means connected to measure the current passing through the third electrode and thereby to provide one of a measurement and control of the common current density at the surface of the third electrode and of the workpiece.

2. Current density controlling apparatus, as in claim 1, in which the workpiece and the third electrodes are cathodes.

3. Current density controlling apparatus, as in claim 1, in which the third electrode is dimensioned to be of comparable size to a typical workpiece.

4. Current density controlling apparatus, as in claim 1, in which the third electrode is a disc of material which is thick relative to the diameter thereof.

5. Current density controlling apparatus, as in claim 1, in which the third electrode is supported within the chamber by an electrical conductor which is electrically insulated.

6. Current density controlling apparatus, as in claim 1, including a voltage adjustor connected to adjust the voltage across the said one and second electrodes, means responsive to the current passing through the third electrode, said means connected to adjust the voltage adjustor in a manner to maintain substantially constant current density on the workpiece and third electrode.

7. An ionic process vacuum furnace, including a chamber in which the workpiece is located and connected as one electrode of one polarity, a second electrode operative within the chamber and connected at the opposite polarity, gas supply means to provide a gaseous atmosphere within the chamber of required composition, temperature and pressure, wherein the improvement comprises a third electrode of known area within the chamber connected to be at the same polarity and potential as the workpiece, and located adjacent the workpiece and current measuring means connected to measure the current passing through the third electrode and thereby to provide one of a measurement and control of the common current density at the surface of the third electrode and of the workpiece.

8. An ionic process vacuum furnace, as in claim 7, in which the lining surface of the chamber is the said second electrode.

9. An ionic process vacuum furnace, as in claim 7, including a table on which the workpiece may be supported.

* * * * *

REEXAMINATION CERTIFICATE (801st)

United States Patent [19]
Davenport et al.

[11] B1 4,587,458
[45] Certificate Issued  Dec. 22, 1987

[54] CONTROLLING CURRENT DENSITY

[75] Inventors: John Davenport, Cambridge, England; Michael A. Russo, Trevose, Pa.

[73] Assignee: TI (Group Services) Limited, Birmingham, England

Reexamination Request:
No. 90/001,259, Jun. 5, 1987

Reexamination Certificate for:
Patent No.: 4,587,458
Issued: May 6, 1986
Appl. No.: 629,812
Filed: Jul. 11, 1984

[30] Foreign Application Priority Data

Feb. 17, 1984 [GB] United Kingdom ............... 8404173

[51] Int. Cl.⁴ .................... G01N 23/00; H01J 7/24
[52] U.S. Cl. .......................... 315/111.01; 250/309; 250/310; 250/492.2; 250/492.3; 315/111.81; 118/664; 250/252.1
[58] Field of Search ................ 250/309, 252.1, 492.2, 250/492.3; 315/111.01, 111.81, 307, 362, 363; 427/38; 204/298, 192.31; 118/50.1, 723, 664

[56] References Cited

U.S. PATENT DOCUMENTS

| | | | |
|---|---|---|---|
| 3,071,533 | 1/1963 | Blankenship | 118/664 |
| 3,383,238 | 5/1968 | Unzicker | 118/664 |
| 4,166,783 | 9/1979 | Turner | 204/298 |
| 4,579,639 | 4/1986 | Enomoto et al. | 427/38 |
| 4,588,942 | 5/1986 | Kitahara | 204/298 |

FOREIGN PATENT DOCUMENTS

619599  3/1949  United Kingdom .

*Primary Examiner*—Harold Dixon

[57] ABSTRACT

A vacuum furnace for the ionic surface treatment of workpieces in which the workpiece is connected as one of a pair of electrodes of opposite polarity, and in which a third electrode is located adjacent the workpiece and is connected to it at the same polarity and potential so as to be subject to the same current density as the workpiece, the current through the third electrode being used to indicate said workpiece current density and to control it.

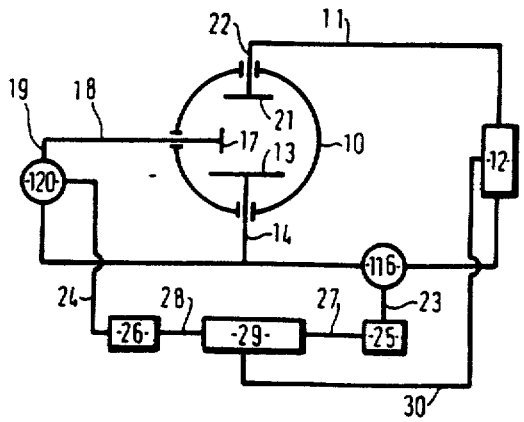

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–9 is confirmed.

* * * * *